(12) United States Patent
Min et al.

(10) Patent No.: US 9,911,723 B2
(45) Date of Patent: Mar. 6, 2018

(54) MAGNETIC SMALL FOOTPRINT INDUCTOR ARRAY MODULE FOR ON-PACKAGE VOLTAGE REGULATOR

(71) Applicant: Intel Corporation, Santa Clara, CA (US)

(72) Inventors: Yongki Min, Phoenix, AZ (US); Reynaldo A. Olmedo, Phoenix, AZ (US); William J. Lambert, Chandler, AZ (US); Kaladhar Radhakrishnan, Chandler, AZ (US); Leigh E. Wojewoda, Tempe, AZ (US); Venkat Anil K. Magadala, Fremont, CA (US); Clive R. Hendricks, Gilbert, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/974,978

(22) Filed: Dec. 18, 2015

(65) Prior Publication Data

US 2017/0179094 A1    Jun. 22, 2017

(51) Int. Cl.
*H01L 25/18* (2006.01)
*H01L 23/00* (2006.01)
(Continued)

(52) U.S. Cl.
CPC .............. *H01L 25/18* (2013.01); *H01F 17/00* (2013.01); *H01L 23/49827* (2013.01); *H01L 23/49838* (2013.01); *H01L 23/5227* (2013.01); *H01L 24/06* (2013.01); *H01L 25/0655* (2013.01); *H01L 25/0657* (2013.01);
(Continued)

(58) Field of Classification Search
None
See application file for complete search history.

(56) References Cited

U.S. PATENT DOCUMENTS 6,759,746 B1    7/2004  Davies
2003/0089979 A1  5/2003  Malinowski et al.
(Continued)

FOREIGN PATENT DOCUMENTS

JP    2013045849 A    3/2013

OTHER PUBLICATIONS

"International Application Serial No. PCT/US2016/060953, International Search Report dated Feb. 14, 2017", 3 pgs.
(Continued)

*Primary Examiner* — Alexander Ghyka
(74) *Attorney, Agent, or Firm* — Schwegman Lundberg & Woessner, P.A.

(57) ABSTRACT

An apparatus comprises an inductor module including: a module substrate including a magnetic dielectric material; a plurality of inductive circuit elements arranged in the module substrate, wherein an inductive circuit element includes conductive traces arranged as a coil including a first coil end, a second coil end and a coil core, wherein the coil core includes the magnetic dielectric material; and a plurality of conductive contact pads electrically coupled to the first and second coil ends. The contact pads electrically coupled to the first coil ends are arranged on a first surface of the inductor module, and the contact pads electrically coupled to the second coil ends are arranged on a second surface of the inductor module.

11 Claims, 5 Drawing Sheets

(51) Int. Cl.
*H01L 23/498* (2006.01)
*H01L 23/522* (2006.01)
*H01L 25/065* (2006.01)
*H01L 25/16* (2006.01)
*H01F 17/00* (2006.01)

(52) U.S. Cl.
CPC ........ *H01L 25/16* (2013.01); *H01L 2924/143* (2013.01); *H01L 2924/1427* (2013.01); *H01L 2924/19011* (2013.01); *H01L 2924/19042* (2013.01)

(56) References Cited

U.S. PATENT DOCUMENTS

| | | |
|---|---|---|
| 2008/0054428 A1 | 3/2008 | Lam |
| 2009/0243780 A1* | 10/2009 | Inoue .................. H01F 1/15366 336/200 |
| 2014/0251669 A1 | 9/2014 | Manusharow et al. |
| 2014/0264732 A1* | 9/2014 | Elsherbini ............... H01L 27/06 257/531 |
| 2015/0187488 A1 | 7/2015 | Williams et al. |

OTHER PUBLICATIONS

"International Application Serial No. PCT/US2016/060953, Written Opinion dated Feb. 14, 2017", 10 pgs.

\* cited by examiner

US 9,911,723 B2

MAGNETIC SMALL FOOTPRINT INDUCTOR ARRAY MODULE FOR ON-PACKAGE VOLTAGE REGULATOR

TECHNICAL FIELD

Embodiments pertain to packaging of integrated circuits. Some embodiments relate to including inductors in integrated circuit packages.

BACKGROUND

Electronic systems often include integrated circuits (ICs) that are connected to a subassembly such as a substrate or motherboard. The ICs can be included in an IC package that is mounted on the subassembly. As electronic system designs become more complex, it is a challenge to meet the desired size constraints of the system. One aspect that can influence the overall size of a design is spacing required for inductive circuit elements that traditionally are relatively large. As the size of the electronic circuit assemblies are reduced and electronic packages become more complex, the packaged electronic assemblies can become less robust and the cost of meeting the spacing requirements can increase. Thus, there are general needs for devices, systems and methods that address the spacing challenges for contacts of ICs yet provide a robust and cost effective design.

DETAILED DESCRIPTION

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

As explained previously, inductive circuit elements can adversely impact the size requirements of an electronic assembly. One approach is to fabricate air core inductors (ACIs) during the manufacturing of the electronic package and incorporate the ACIs into the electronic circuit using metal routing layers of the electronic packaging. ACIs include an insulating dielectric material in the ACI core. They are referred to as ACIs because the insulating dielectric material has the same, or nearly the same, relative magnetic permeability as air (equal to 1.0). However, as ACIs are scaled to higher levels of inductance, the performance of the ACIs degrades and negatively impact the performance of the circuits using the ACIs.

Figure 1:
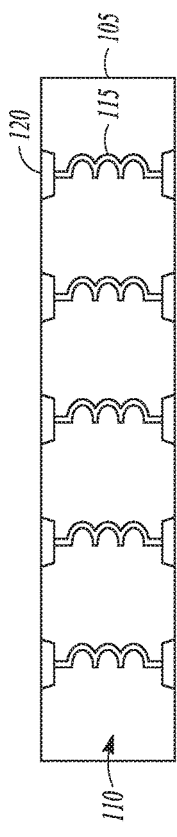
FIG. 1 is a cross section view of an inductor module in accordance with some embodiments.

FIG. 1 is a cross section view of an embodiment of an inductor module 105. The inductor module 105 includes a module substrate 110 that includes a magnetic dielectric material. The magnetic dielectric material may be a high resistivity magnetic material. In some embodiments, the magnetic material is a high resistivity material with relative magnetic permeability $\mu$ greater than one (e.g., $\mu$=2, 5, or larger). In some embodiments, the magnetic dielectric material includes a magnetic particle polymer composite resin. The module substrate 110 also includes multiple inductive circuit elements embedded or otherwise arranged in the module substrate 110. An inductive circuit element can include conductive traces arranged as an inductive coil 115 or inductor. In FIG. 1, the inductive elements are represented as schematic symbol drawings rather than an actual layout. The conductive traces may be included in layers of conductive material available in a substrate fabrication process, such as a process for fabricating package substrates for electronic circuit packages. In certain embodiments, the coils are formed using metal layers available in the fabrication process. In certain variations, the metal layers include one or both of copper and aluminum. The inductive coils 115 include a first coil end, a second coil end, and a coil core that includes the magnetic dielectric material.

The inductor module 105 also includes conductive contact pads 120 electrically coupled to the coil ends. In the embodiment of FIG. 1, the contact pads are arranged on both the top surface and the bottom surface of the inductor module 105. In some embodiments, the inductive circuit elements may all have the same value of inductance. In some embodiments, the inductive circuit elements may have different values of inductance. The inductive circuit elements may be electrically coupled together (e.g., in series) to form an overall value of inductance. The inductor module may then substitute for one or more conventional monolithic inductors and can be used with circuits requiring an inductor.

Figure 2:
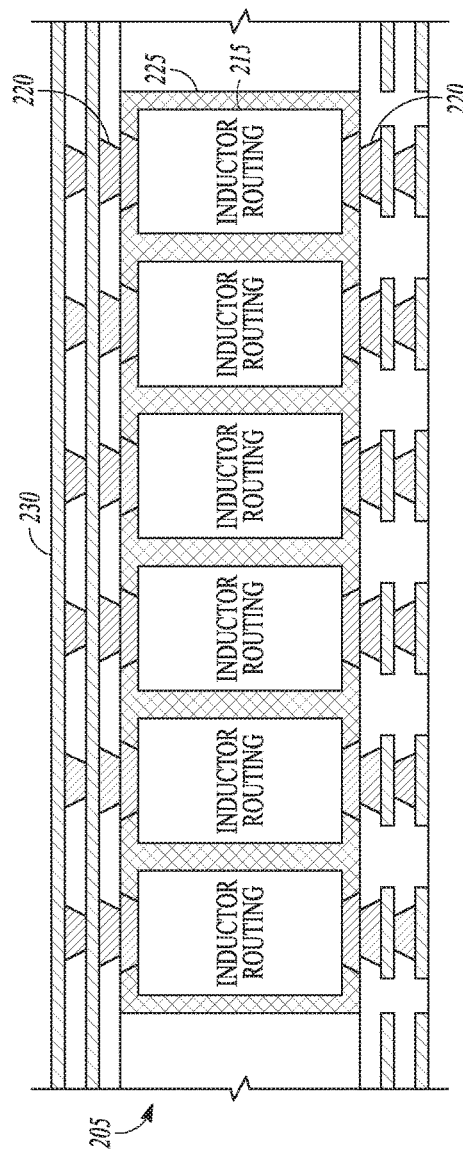
FIG. 2 is a cross section of another inductor module in accordance with some embodiments.

FIG. 2 is a cross section of another embodiment of an inductor module 205. The inductor module 205 includes inductor coils 215 produced using conductive trace routing within a region of magnetic dielectric material 225. The inductor coils 215 are electrically coupled to contact pads 220. One end of a coil is connected to a contact pad on the top surface of the inductor module 205 and the other end of the coil is connected to a contact pad on the bottom surface to form a "thru-module" topology. Conductive interconnect 230 may be located on the surface of the inductor module 205.

Figure 3:
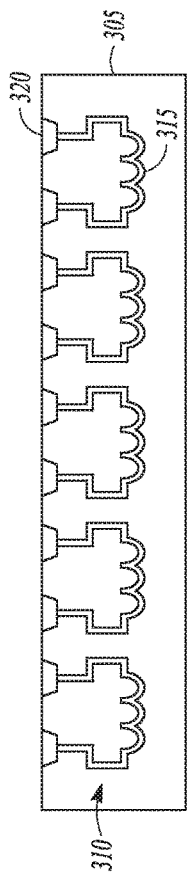
FIG. 3 is a cross section of still another inductor module in accordance with some embodiments.
Figure 4:
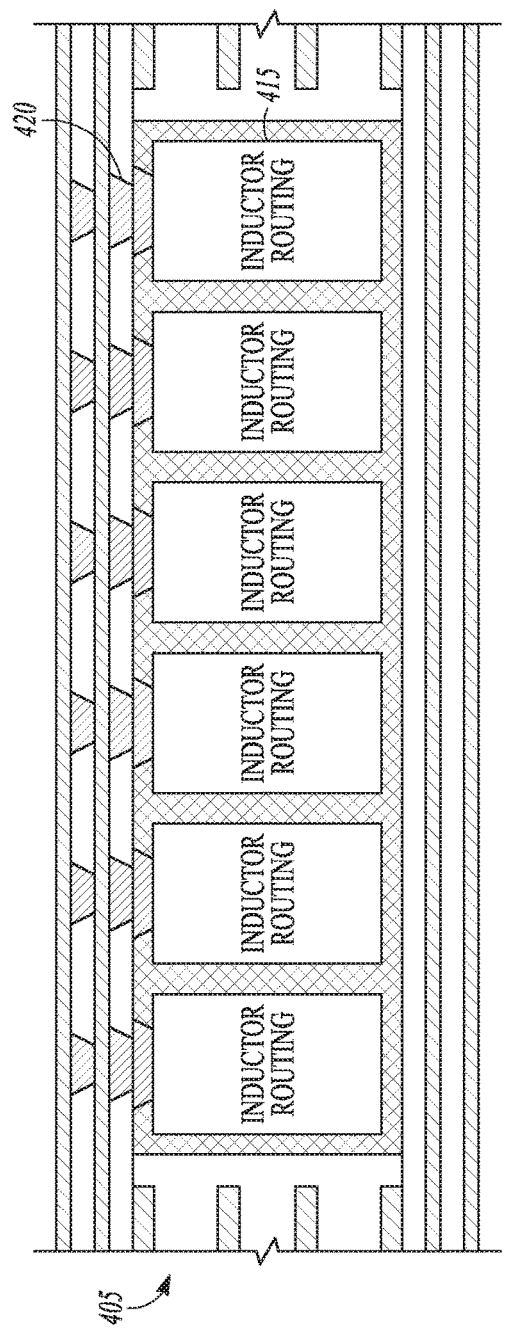
FIG. 4 is a cross section of still another inductor module in accordance with some embodiments.

FIG. 3 is a cross section of another embodiment of an inductor module 305. In the embodiment, the contact pads 320, which are electrically coupled to the ends of the inductor coils 315, are all arranged on one surface of the module substrate 310. This can be referred to as a "single sided" topology. FIG. 4 is a cross section of another embodiment of an inductor module 405. The ends of inductor coils 415 are shown electrically coupled to contact pads 420 on one surface of the inductor module 405.

Figure 5:
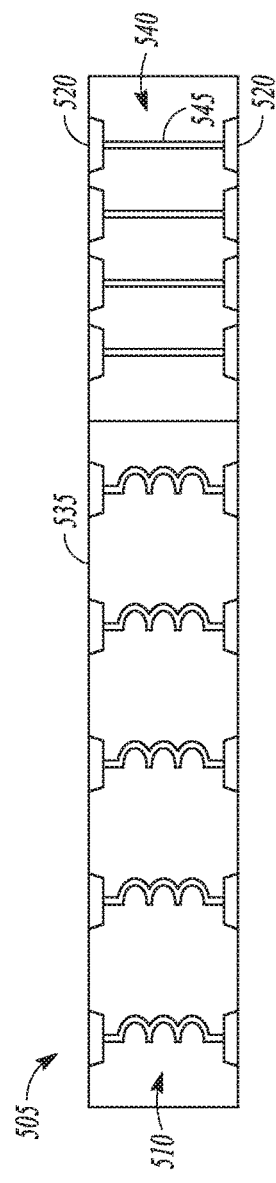
FIG. 5 is a cross section of still another inductor module in accordance with some embodiments.

FIG. 5 is a cross section of another embodiment of an inductor module 505. The embodiment has a thru-module topology, and one end of a coil is connected to a contact pad on the top surface of the inductor module 505 and the other end of the coil is connected to a contact pad on the bottom surface. In the embodiment, the module substrate 510 includes the magnetic dielectric material in a first region 535 of the module substrate 510 and a non-magnetic dielectric material in a second region 540 of the module substrate 510. The first region 535 includes the inductive circuit elements and the second region 540 includes one or more signal vias 545. A signal via can be electrically coupled to a contact pad 520 on the first surface of the inductor module and a contact pad 520 on the second surface of the inductor module 505. The vias provide for signals to be routed through the inductor module 505, which can improve signal routing density in an electronic circuit assembly.

Figure 6:
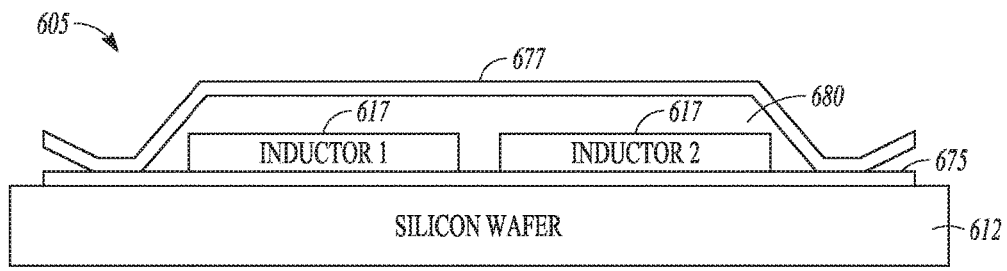
FIG. 6 is a cross section view of still another inductor module in accordance with some embodiments.

FIG. 6 is a cross section view of another embodiment of an inductor module 605. The inductor module 605 includes a silicon substrate 612. In certain examples, multiple inductor modules are formed on a silicon wafer and diced into individual inductor module die. The inductor module 605 includes a first thin film layer 675 of magnetic material disposed on the silicon substrate 612 and an insulating layer 680 arranged above the first thin film layer 675. Multiple inductive circuit elements are arranged in the insulating layer 680. An inductive circuit element includes a conductive trace 617 having a first trace end and a second trace end. In certain embodiments, the conductive traces include copper. A second thin film layer 677 of magnetic material is disposed above the insulating layer 680. The second thin film layer 677 contacts the first thin film layer 675 in one or more locations on the inductor module 605. The first and second thin film layers may form a shell of magnetic material around the inductive circuit elements and the layer of insulating material.

Figure 7:
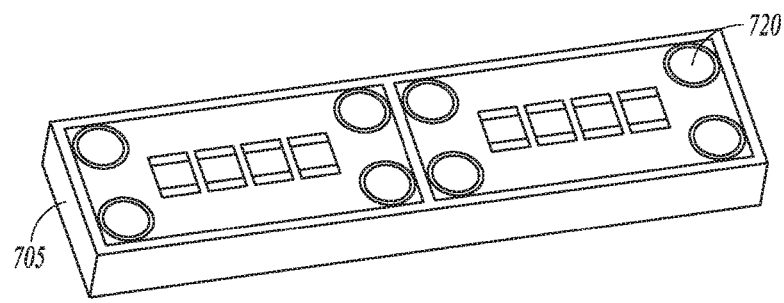
FIG. 7 is a different view of the inductor module of FIG. 6 in accordance with some embodiments.

FIG. 7 is another view of the inductor module of FIG. 6. The inductor module 705 includes conductive contact pads 720 electrically coupled to first trace ends of the conductive traces and are arranged on a top surface of the inductor module 705 and includes conductive contact pads electrically coupled to second trace ends of the conductive traces and arranged on a bottom surface of the inductor module. Thus, the inductor module 705 has a thru-module topology. In certain embodiments, the inductor module 705 includes one or more signal vias (not shown) in the silicon substrate to connect the second trace ends to the contact pads on the bottom surface of the silicon substrate. In certain embodiments, the inductor module 705 includes one or more signal vias between a contact pad on the top surface of the inductor module and a contact on the bottom surface of the inductor module to route signals through the inductor module 705. In other embodiments, the contact pads are all arranged on one surface of the module substrate in a single sided topology similar to the embodiment of FIG. 3.

Figure 8:
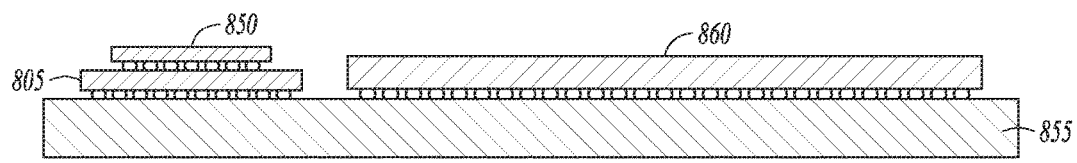
FIG. 8 is a cross section view of an electronic circuit assembly in accordance with some embodiments.

FIG. 8 is a cross section view of an embodiment of an electronic circuit assembly. The assembly includes an inductor module 805 and an IC 850. The inductor module 805 includes a thru-module topology and includes contact pads arranged on both the top surface and the bottom surface of the inductor module 805. In some embodiments, the IC includes a voltage regulator circuit (e.g., a switching regulator circuit). In the embodiment, the IC 850 is arranged on the top surface of the inductor module 805. The assembly may include conductive traces electrically coupling at least a portion of the contact pads of the inductor module 605 to at least a portion of the contact pads of the IC 850. In some embodiments, the contact pads on the bottom surface of the IC are directly bonded to contact pads of the top surface of the inductor module 805. In certain embodiments, the contact pads of the IC 850 and the top surface of the inductor module 805 have a different pitch than the contact pads of the bottom surface of the inductor module 805. Pitch refers to the feature size and spacing available for the contact pads of the IC and inductor module 805. The assembly can include conductive routing (e.g., metal lines) to electrically couple the contact pads.

To reduce the size of electronic circuit assemblies, it may be desired to incorporate power management circuits (e.g., voltage regulator circuits) with circuits of higher density and complexity, such as processor circuits (e.g., a central processor unit or CPU). In some embodiments, the electronic assembly also includes a package substrate 855 for an electronic package assembly and a second IC 860. The second IC 860 can include a CPU, memory controller, or other type of electronic device. The second IC 860 includes contact pads, and the inductor module 805 and the second IC 860 are arranged on the top surface of the package substrate 855. The substrate can include conductive interconnect between contact pads of the inductor module and the contact pads of the second IC 860.

Figure 9:
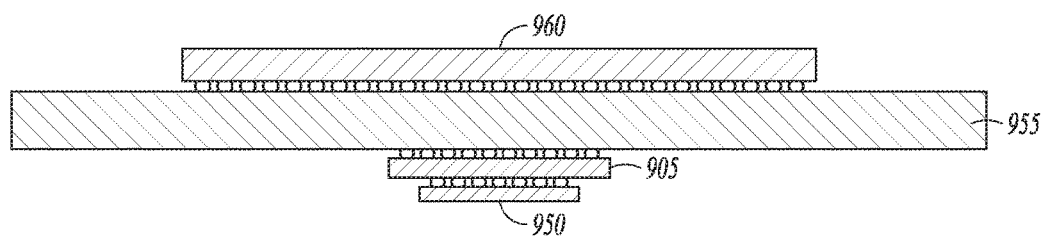
FIG. 9 is a cross section view of another electronic circuit assembly in accordance with some embodiments.

FIG. 9 is a cross section view of another embodiment of an electronic circuit assembly. The assembly includes an inductor module 905, a first IC 950, a second IC 960, and a substrate for an electronic package. The inductor module 905 has a thru-module topology. The first IC 950 may include a voltage regulator circuit and the second IC may include a CPU or other electronic device. The first IC is arranged on a surface of the inductor module 905, and the inductor module 905 is arranged on a first surface (e.g. bottom surface) of the package substrate 955. The second IC 960 is arranged on a second surface (e.g., top surface) of the substrate. The substrate includes conductive interconnect between contact pads of the inductor module and contact pads of the second IC.

Figure 10:
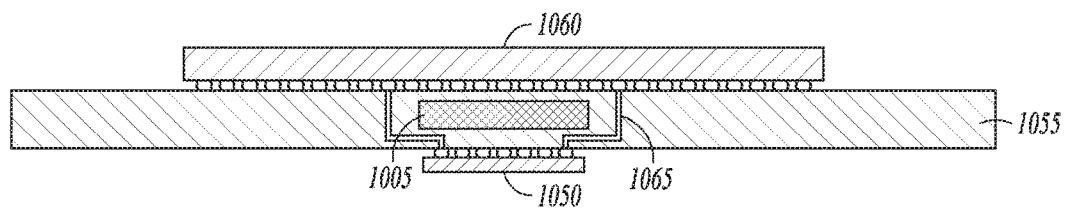
FIG. 10 is a cross section view of still another electronic circuit assembly in accordance with some embodiments.

FIG. 10 is a cross section view of another embodiment of an electronic circuit assembly. The assembly includes an inductor module 1005, a first IC 1050, and a package substrate 1055. The inductor module 1005 is arranged (e.g., embedded) in the substrate. In some embodiments, a recess or cavity is formed in the package substrate during a substrate manufacturing process and the inductor module is placed inside the recess or cavity. The coefficient of thermal expansion (CTE) of the inductor module substrate may match the CTE of the package substrate material. The recess may be milled into the package substrate and the inductor module may be held to the substrate with adhesive.

The first IC 1050 is arranged on a surface of the substrate/module assembly above the inductor module 1005. In certain embodiments, a surface of the inductor module 1005 is at a surface of the package substrate. In certain embodiments, the surface of the inductor module 1005 is below the surface of the package substrate, and the package substrate includes conductive interconnect (e.g., multiple metal layers) on either side of the inductor module. The conductive interconnect may include input/output routing to contact pads or for routing circuit power.

The assembly can include a second IC 1060. The first IC 1050 can include a power management circuit and can be arranged on a first surface of the package substrate 1055 and the second IC 1060 can be arranged on a second surface of the package substrate 1055 opposite the first surface. In the example embodiment of FIG. 10, the first IC 1050 is arranged on the bottom surface of the substrate and the second IC 1060 is arranged on the top surface. The inductor module 1005 includes the thru-module topology and includes contact pads arranged on both the top surface and the bottom surface of the inductor module 1005. The surfaces of the inductor module 1005 can be at the surfaces of the package substrate. In certain embodiments, the surfaces of the inductor module 1005 can be below the surfaces of the package substrate 1055, and the package substrate includes conductive interconnect between contact pads of the inductor module and contact pads of the second IC. In some embodiments, the package substrate includes conductive interconnect between at least a portion of the contacts pads of the first IC and contact pads of the second IC to route signals between the first and second IC.

Figure 11:
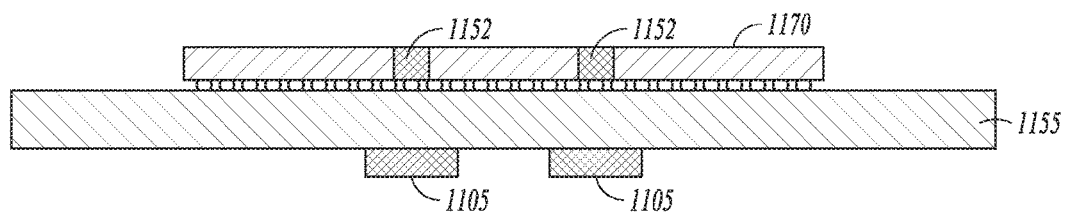
FIG. 11 is a cross section view of still another electronic circuit assembly in accordance with some embodiments.

FIG. 11 is a cross section view of another embodiment of an electronic circuit assembly. The assembly includes an inductor module 1105, a package substrate 1155, and an IC 1170. The contact pads of the inductor module 1105 are all arranged on one surface of the inductor module substrate. The IC 1170 is arranged on a separate surface of the package substrate 1155 from the inductor module 1105. In the example embodiment of FIG. 11, the IC 1170 is arranged on the top surface of the package substrate 1155 and inductor modules are arranged on the bottom surface of the package substrate 1155. The package substrate 1155 includes conductive interconnect between the inductor module and the IC 1170. In certain embodiments, the IC 1170 includes one or more power management circuits 1152. In certain embodiments, the IC 1170 includes a CPU 1160 or other electronic device and one or more power management circuits.

Figure 12:
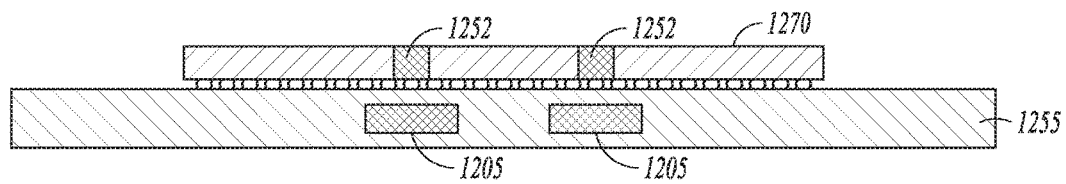
FIG. 12 is a cross section view of still another electronic circuit assembly in accordance with some embodiments.

FIG. 12 is a cross section view of another embodiment of an electronic circuit assembly. Like the example embodiment of FIG. 11, the assembly includes an inductor module 1205, a package substrate 1255, and an IC 1270. The IC 1270 can include one or more power management circuits 1252 and a CPU. The contact pads of the inductor module 1205 are all arranged on one surface of the inductor module substrate. In this embodiment example, one or more inductor modules are arranged within the package substrate 1255.

Figure 13:
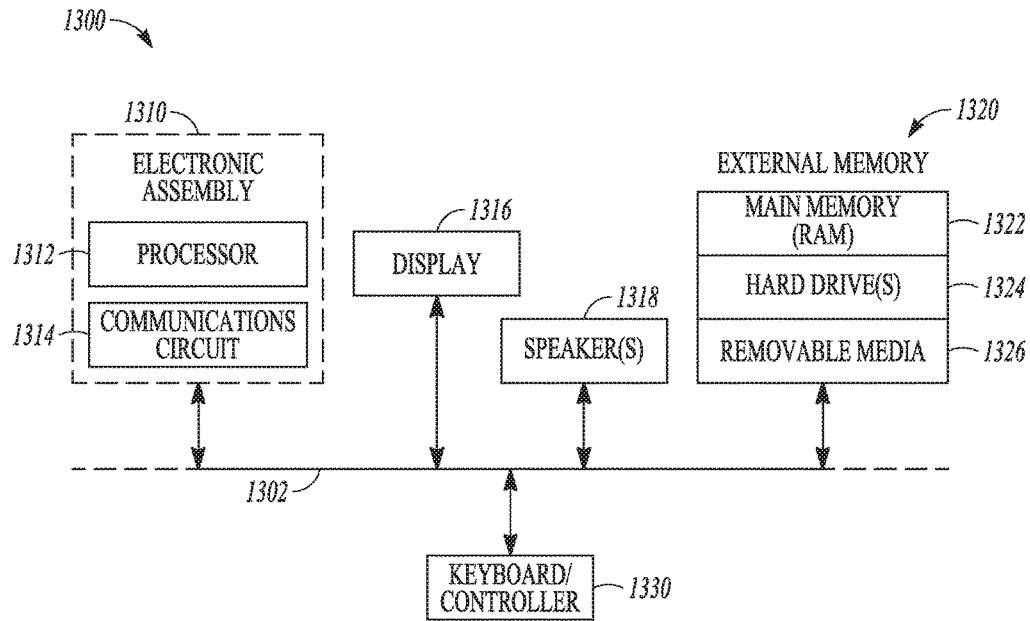
FIG. 13 is a flow diagram of a method of making an inductor module in accordance with some embodiments.

FIG. 13 is a block diagram of an example of an electronic system 1300 incorporating at least one electronic circuit assembly and in accordance with at least one embodiment of the invention. Electronic system 1300 is merely one example in which embodiments of the present invention can be used. Examples of electronic systems 1300 include, but are not limited to personal computers, tablet computers, mobile telephones, game devices, etc. In this example, electronic system 1300 comprises a data processing system that includes a system bus 1302 to couple the various components of the system. System bus 1302 provides communications links among the various components of the electronic system 1300 and can be implemented as a single bus, as a combination of busses, or in any other suitable manner.

An electronic assembly 1310 can be coupled to system bus 1302. The electronic assembly 1310 can include any circuit or combination of circuits. In one embodiment, the electronic assembly 1310 includes a processor 1312 which can be of any type. As used herein, "processor" means any type of computational circuit, such as but not limited to a microprocessor, a microcontroller, a complex instruction set computing (CISC) microprocessor, a reduced instruction set computing (RISC) microprocessor, a very long instruction word (VLIW) microprocessor, a graphics processor, a digital signal processor (DSP), multiple core processor, or any other type of processor or processing circuit.

Other types of circuits that can be included in electronic assembly 1310 are a custom circuit, an application-specific integrated circuit (ASIC), or the like, such as, for example, one or more circuits (such as a communications circuit 1314 for use in wireless devices like mobile telephones, personal data assistants, portable computers, two-way radios, and similar electronic systems. The IC can perform any other type of function.

The electronic system 1300 can also include an external memory 520, which in turn can include one or more memory elements suitable to the particular application, such as a main memory 1322 in the form of random access memory (RAM), one or more hard drives 1324, and/or one or more drives that handle removable media 1326 such as compact disks (CD), flash memory cards, digital video disk (DVD), and the like.

The electronic system 1300 can also include a display device 1316, one or more speakers 1318, and a keyboard and/or controller 1330, which can include a mouse, trackball, touch screen, voice-recognition device, or any other device that permits a system user to input information into and receive information from the electronic system 1300.

Figure 14:
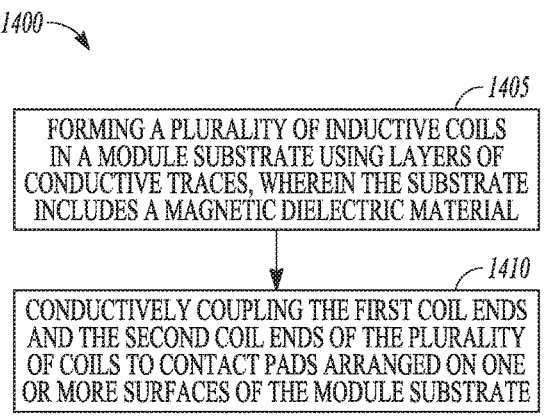
FIG. 14 is an electronic system in accordance with some embodiments.

FIG. 14 is a flow diagram of a method of making an inductor module. At 1405, multiple inductive circuit elements are formed in a module substrate. The module substrate includes a magnetic dielectric material. In some embodiments, the magnetic material includes polymer composite resin that includes magnetic particles. In some embodiments, the inductive circuit elements are inductor coils formed using layers of conductive traces. In some examples the conductive traces include copper. The inductive coils includes a first coil end, a second coil end, and a coil core of the magnetic dielectric material. The magnetic core of the inductor coils allows for increased inductance values of the coils over air core inductors of comparable size and provides improved performance over air core inductors.

At 1410, the first coil ends and the second coil ends of the inductor coils are conductively coupled to contact pads arranged on one or more surfaces of the module substrate. The conductive coupling may include conductive traces formed in the substrate module to extend from the coil ends to the contact pads. In some embodiments, the conductive pads coupled to the first coil ends are arranged on a first surface (e.g., top surface) of the module substrate and the conductive pads coupled to the second coil ends are arranged on a second surface (e.g., bottom surface) of the module substrate.

In some embodiments, the module substrate with the magnetic dielectric material is formed to have a CTE that matches the CTE of the material of the substrate of an electronic package. This allows the inductor module to be embedded in the substrate material of the electronic package, such as shown in the embodiment examples of FIGS. 10 and 12. In some embodiments, the inductor module is embedded in the substrate by cutting a hole in the substrate core module and gluing the inductor module in place. Routing layers (e.g., metal layers) can be formed above and below the substrate core to add interconnect for the inductor module.

The devices, systems, and methods described that use an inductive module formed with magnetic dielectric material can allow for small electronic packaging while improving the scalability of the inductance of the inductors of the module. The higher values of inductance reduce degradation of performance as the inductance value is scaled to higher values.

Additional Description and Examples

Example 1 can include subject matter (such as an apparatus) comprising an inductor module including: a module substrate including a magnetic dielectric material; a plurality of inductive circuit elements arranged in the module substrate, wherein an inductive circuit element includes conductive traces arranged as a coil including a first coil end, a second coil end and a coil core, wherein the coil core includes the magnetic dielectric material; and a plurality of conductive contact pads electrically coupled to the first and second coil ends, wherein contact pads electrically coupled to the first coil ends are arranged on a first surface of the inductor module, and the contact pads electrically coupled to the second coil ends are arranged on a second surface of the inductor module.

In Example 2, the subject matter of Example 1 optionally includes magnetic dielectric material that includes a magnetic particle polymer composite resin.

In Example 3, the subject matter of one or both of Examples 1 and 2 optionally includes a module substrate including the magnetic dielectric in a first region and a non-magnetic dielectric region in a second region, wherein the first region includes the inductive circuit elements and the second region includes one or more signal vias, wherein a signal via is electrically coupled to a contact pad on the first surface of the inductor module and a contact pad on the second surface of the inductor module.

In Example 4, the subject matter of one or any combination of Examples 1-3 optionally includes a first integrated circuit (IC) including contact pads; and conductive interconnect electrically coupling at least a portion of the contact pads of the inductor module to at least a portion of the contact pads of the IC.

In Example 5, the subject matter of Example 4 optionally includes the first IC including a voltage regulator circuit.

In Example 6, the subject matter of one or any combination of Examples 4 and 5 optionally includes the first IC is arranged on a surface of the inductor module.

In Example 7, the subject matter of one or any combination of Examples 4-6 optionally includes a package substrate of an electronic package assembly; and a second IC that includes contact pads, wherein the inductor module and the second IC are arranged on a first surface of the package substrate, and the first IC is arranged on a surface of the inductor module, wherein the substrate includes conductive interconnect between contact pads of the inductor module and contact pads of the second IC.

In Example 8, the subject matter of one or any combination of Examples 4-6 optionally includes a package substrate of an electronic package assembly and a second IC; wherein the first IC is arranged on a surface of the inductor module, the inductor module is arranged on a first surface of the package substrate, and the second IC is arranged on a second surface of the substrate, wherein the second substrate includes contact pads and the substrate includes conductive interconnect between contact pads of the inductor module and contact pads of the second IC.

In Example 9, the subject matter of one or any combination of Examples 1-8 optionally includes a package substrate of an electronic package assembly, wherein the inductor module is arranged in the package substrate and the package substrate includes the conductive interconnect.

In Example 10, the subject matter of one or any combination of Examples 1-6 and 9 optionally includes a second IC, wherein the first IC includes a voltage regulator circuit and is arranged on a first surface of the package substrate, the second IC includes a processor circuit arranged on a second surface of the package substrate, and the package substrate includes the conductive interconnect electrically coupling at least a portion of the contact pads of the inductor module to at least a portion of the contact pads of the first IC, and includes conductive interconnect electrically coupling at least a portion of the contact pads of the first IC to at least a portion of the contact pads of the second IC.

Example 11 includes subject matter (such as an apparatus), or can optionally be combined with one or any combination of Examples 1-10 to include such subject matter, comprising an integrated circuit (IC); an inductor module including: a module substrate including a magnetic dielectric material; a plurality of inductive circuit elements arranged in the module substrate, wherein an inductive circuit element includes conductive traces arranged as a coil including a first coil end, a second coil end and a coil core, wherein the coil core includes the magnetic dielectric material; and a plurality of conductive contact pads electrically coupled to first coil and second coil ends and arranged on one surface of the inductor module; and a package substrate of an electronic package assembly, wherein the package substrate includes conductive interconnect between the inductor module and the IC, and the IC is arranged on a separate surface of the package substrate from the inductor module.

In Example 12, the subject matter of Example 11 optionally includes an IC that is arranged on a first surface of the package substrate and includes a voltage regulator circuit and a processor circuit, and wherein the inductor module is arranged on a second surface of the package substrate.

In Example 13, the subject matter of Example 11 optionally includes an IC that is arranged on a first surface of the package substrate and includes a voltage regulator circuit and a processor circuit, the inductor module is arranged within the package substrate.

In Example 14, the subject matter of one or any combination of Examples 11-13 optionally includes the magnetic dielectric material including a magnetic particle polymer composite resin.

Example 15 includes subject matter (such as an apparatus), or can optionally be combined with one or any combination of Examples 1-14 to include such subject matter, comprising an inductor module including: a silicon substrate; a first thin film layer of magnetic material disposed on the substrate; an insulating layer arranged above the first thin film layer; a plurality of inductive circuit elements arranged in the insulating layer, wherein an inductive circuit element includes a conductive trace having a first trace end and a second trace end; a second thin film layer of magnetic material disposed above insulating layer, wherein the second thin film layer contacts the first thin film layer in one or more locations on the inductor module; and a first plurality of conductive contact pads electrically coupled to first trace ends and arranged on a top surface of the inductor module, and a second plurality of conductive contact pads electrically coupled to second trace ends and arranged on a bottom surface of the inductor module.

In Example 16, the subject matter of Example 15 optionally includes a first integrated circuit (IC) including contact pads and a voltage regulator circuit; and conductive interconnect electrically coupling at least a portion of the contact pads of the inductor module to at least a portion of the contact pads of the IC.

In Example 17, the subject matter of Example 16 optionally includes a package substrate of an electronic package assembly; and a second IC that includes contact pads, wherein the inductor module and the second IC are arranged on a first surface of the package substrate, and the first IC is arranged on a surface of the inductor module, wherein the substrate includes conductive interconnect between contact pads of the inductor module and contact pads of the second IC.

In Example 18, the subject matter of Example 16, optionally includes a package substrate of an electronic package assembly and a second IC; wherein the first IC is arranged on a surface of the inductor module, the inductor module is arranged on a first surface of the package substrate, and the second IC is arranged on a second surface of the substrate, wherein the second substrate includes contact pads and the substrate includes conductive interconnect between contact pads of the inductor module and contact pads of the second IC.

In Example 19, the subject matter of one or any combination of Examples 15-18 optionally includes a package substrate of an electronic package assembly, wherein the inductor module is arranged in the package substrate and the package substrate includes the conductive interconnect.

In Example 20, the subject matter of Example 19 optionally includes a second IC, wherein the first IC includes a voltage regulator circuit and is arranged on a first surface of the package substrate, the second IC includes a processor circuit arranged on a second surface of the package substrate, and the package substrate includes the conductive interconnect electrically coupling at least a portion of the contact pads of the inductor module to at least a portion of the contact pads of the first IC, and includes conductive interconnect electrically coupling at least a portion of the contact pads of the first IC to at least a portion of the contact pads of the second IC.

Example 21 includes subject matter (such as an electronic assembly), or can optionally be combined with the subject matter of one or any combination of Examples 1-20 to include such subject matter, comprising a first IC including contact pads and a voltage regulator circuit; and an inductor module including: a module substrate including a magnetic dielectric material; a plurality of inductive circuit elements arranged in the module substrate, wherein an inductive circuit element includes conductive traces arranged as a coil including a first end and a second end and a core, wherein the coil core includes the magnetic dielectric material; and a plurality of conductive contact pads electrically coupled to the first and second coil ends and arranged on one or more module surfaces, wherein the IC is arranged on a surface of the inductor module and wherein at least a portion of the contact pads of the inductor module are electrically coupled to the contact pads of the voltage regulator circuit.

In Example 22, the subject matter of Example 21 optionally includes a second IC including a processor circuit and contact pads; and a package substrate for an electronic package assembly, wherein the inductor module and the second IC are arranged on a first surface of the package substrate and the first IC is arranged on the inductor module, and wherein the package substrate includes conductive interconnect between contact pads of the inductor module and contact pads of the second IC.

In Example 23, the subject matter of Example 21 optionally includes a second IC including a processor circuit and contact pads; a package substrate of an electronic package assembly, wherein the first IC and the inductor module are arranged on a first surface of the package substrate and the second IC is arranged on a second surface of the package substrate, wherein the package substrate includes conductive interconnect between contact pads of the inductor module and contact pads of the second IC.

In Example 24, the subject matter of Example 21 optionally includes a second IC including a processor circuit and contact pads; and a package substrate of an electronic package assembly, wherein the inductor module is embedded in the package substrate, wherein the first IC is arranged on a first surface of the package substrate, the second IC is arranged on a second surface of the package substrate, and the inductor module includes one or more vias electrically coupled to one or more contact pads of the first IC and one or more contacts pads of the second IC.

In Example 25, the subject matter of Example 24 optionally includes a module substrate of the inductor module having a coefficient of thermal expansion (CTE) that matches the CTE of the package substrate of the electronic package assembly.

The Abstract is provided to comply with 37 C.F.R. Section 1.72(b) requiring an abstract that will allow the reader to ascertain the nature and gist of the technical disclosure. It is submitted with the understanding that it will not be used to limit or interpret the scope or meaning of the claims. The following claims are hereby incorporated into the detailed description, with each claim standing on its own as a separate embodiment.

What is claimed is:

1. An apparatus comprising:
an inductor module including:
a module substrate including a magnetic dielectric material;
a first surface at the top of the inductor module and a second surface at the bottom of the inductor module;
a plurality of inductive circuit elements arranged in the module substrate, wherein an inductive circuit element includes conductive traces arranged as a coil oriented to extend in the direction from the first surface to the second surface and including a first coil end, a second coil end and a coil core, wherein the coil core includes the magnetic dielectric material; and
a plurality of conductive contact pads electrically coupled to the first and second coil ends, wherein contact pads electrically coupled to the first coil ends are arranged on the first surface, and the contact pads electrically coupled to the second coil ends are arranged on the second surface.

2. The apparatus of claim 1, wherein the magnetic dielectric material includes a magnetic particle polymer composite resin.

3. The apparatus of claim 1, wherein the module substrate includes the magnetic dielectric in a first region and a non-magnetic dielectric region in a second region, wherein the first region includes the inductive circuit elements and the second region includes one or more signal vias, wherein a signal via is electrically coupled to a contact pad on the first surface of the inductor module and a contact pad on the second surface of the inductor module.

4. The apparatus of claim 1, including:
a first integrated circuit (IC) including contact pads; and
conductive interconnect electrically coupling at least a portion of the contact pads of the inductor module to at least a portion of the contact pads of the IC.

5. The apparatus of claim 4, wherein the first IC includes a voltage regulator circuit.

6. The apparatus of claim 5, wherein the first IC is arranged on a surface of the inductor module.

7. The apparatus of claim 4, including:
a package substrate of an electronic package assembly; and
a second IC that includes contact pads, wherein the inductor module and the second IC are arranged on a first surface of the package substrate, and the first IC is arranged on a surface of the inductor module, wherein the substrate includes conductive interconnect between contact pads of the inductor module and contact pads of the second IC.

8. The apparatus of claim 4, including a package substrate of an electronic package assembly and a second IC; wherein the first IC is arranged on a surface of the inductor module, the inductor module is arranged on a first surface of the package substrate, and the second IC is arranged on a second surface of the substrate, wherein the second substrate includes contact pads and the substrate includes conductive interconnect between contact pads of the inductor module and contact pads of the second IC.

9. The apparatus of claim 4, including a package substrate of an electronic package assembly, wherein the inductor module is arranged in the package substrate and the package substrate includes the conductive interconnect.

10. The apparatus of claim 9, wherein the apparatus includes a second IC, wherein the first IC includes a voltage regulator circuit and is arranged on a first surface of the package substrate, the second IC includes a processor circuit arranged on a second surface of the package substrate, and the package substrate includes the conductive interconnect electrically coupling at least a portion of the contact pads of the inductor module to at least a portion of the contact pads of the first IC, and includes conductive interconnect electrically coupling at least a portion of the contact pads of the first IC to at least a portion of the contact pads of the second IC.

11. The apparatus of claim 1, wherein the inductor module includes a thru module topology, and an inductive circuit element of the plurality of inductive circuit elements extends from a contact pad arranged on the first surface at the top of the inductor module to a contact pad arranged on the bottom surface of the inductor module.

* * * * *